(12) United States Patent
Taylor et al.

(10) Patent No.: US 7,433,215 B2
(45) Date of Patent: *Oct. 7, 2008

(54) INVERTER STARTUP ALGORITHM

(75) Inventors: Bill Taylor, Bend, OR (US); Brian Hoffman, Bend, OR (US)

(73) Assignee: PV Powered, Inc., Bend, OR (US)

( * ) Notice: Subject to any disclaimer, the term of this patent is extended or adjusted under 35 U.S.C. 154(b) by 74 days.

This patent is subject to a terminal disclaimer.

(21) Appl. No.: 11/580,513

(22) Filed: Oct. 13, 2006

(65) Prior Publication Data

US 2007/0084498 A1 Apr. 19, 2007

Related U.S. Application Data

(63) Continuation-in-part of application No. 11/400,761, filed on Apr. 7, 2006.

(60) Provisional application No. 60/669,487, filed on Apr. 7, 2005.

(51) Int. Cl.
*H02M 3/24* (2006.01)
*H01L 31/042* (2006.01)

(52) U.S. Cl. ................................ 363/95; 136/244
(58) Field of Classification Search ............... 363/95, 363/120; 136/244
See application file for complete search history.

(56) References Cited

U.S. PATENT DOCUMENTS

| | | | | | |
|---|---|---|---|---|---|
| 4,649,334 | A | * | 3/1987 | Nakajima | 323/299 |
| 6,339,538 | B1 | * | 1/2002 | Handleman | 363/95 |
| 6,429,546 | B1 | * | 8/2002 | Ropp et al. | 307/31 |
| 6,493,246 | B2 | * | 12/2002 | Suzui et al. | 363/95 |
| 7,126,294 | B2 | * | 10/2006 | Minami et al. | 318/139 |
| 7,158,395 | B2 | * | 1/2007 | Deng et al. | 363/95 |
| 2005/0063115 | A1 | * | 3/2005 | Nayar et al. | 361/82 |
| 2005/0110454 | A1 | * | 5/2005 | Tsai et al. | 320/101 |

* cited by examiner

*Primary Examiner*—Thuy Vinh Tran
(74) *Attorney, Agent, or Firm*—Perkins Coie LLP

(57) ABSTRACT

A method for the startup of a solar power three-phase inverter in which a waiting period is increased between successive attempts to start the inverter. This method allows the inverter to start up in a reasonable amount of time while avoiding excessive cycling during prolonged periods of low light.

4 Claims, 1 Drawing Sheet

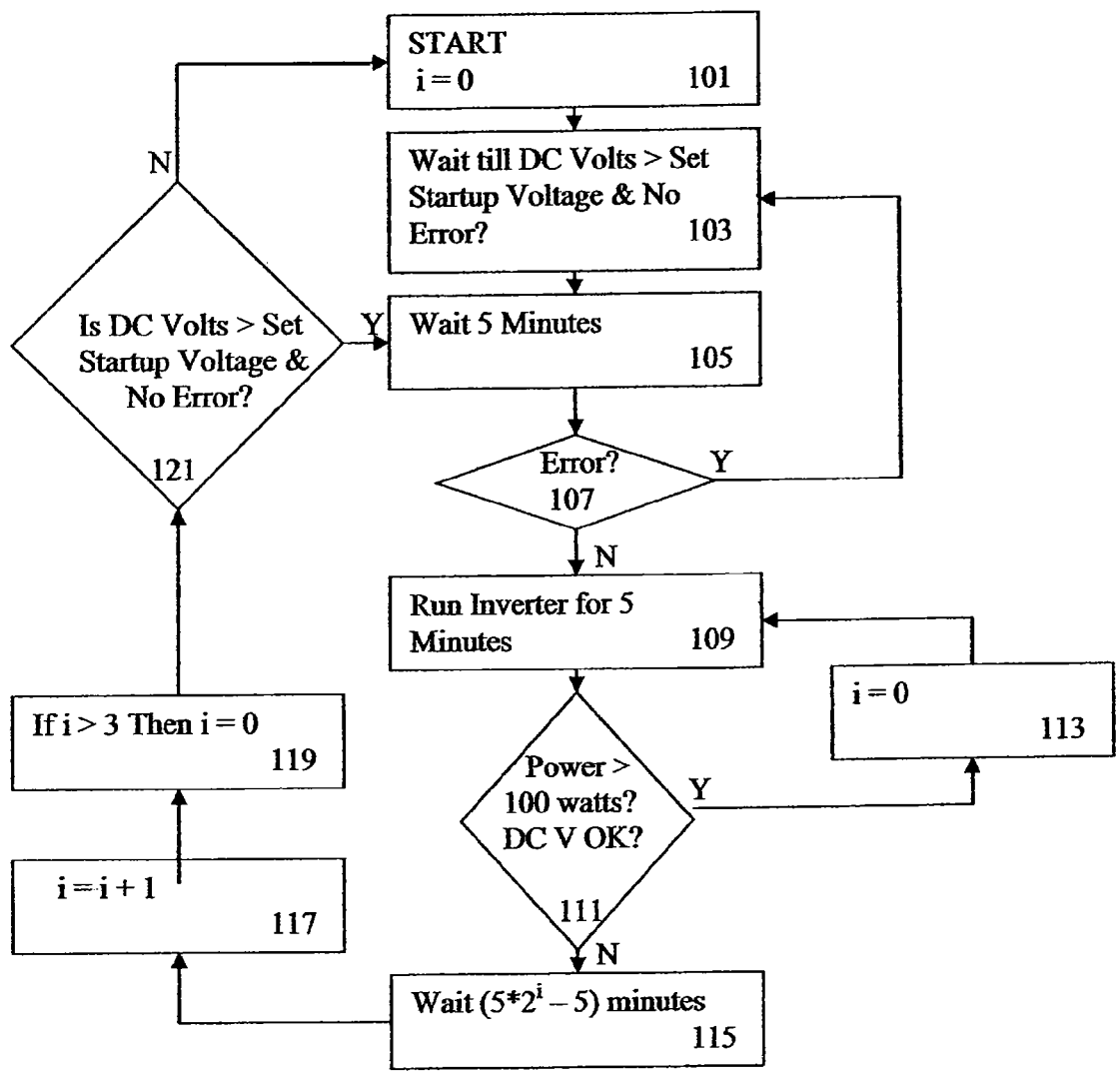

INVERTER STARTUP ALGORITHM

RELATED APPLICATIONS

This application is a Continuation In Part of co-pending U.S. patent application Ser. No. 11/400,761 which was filed on Apr. 7, 2006 and which claimed priority under 35 U.S.C. § 119(e) to U.S. Provisional Patent Application No. 60/669,487 which was filed on Apr. 7, 2005. Co-pending patent application Ser. Nos. 11/187,059 11/400,720, 11/400,776, 11/400,786, 11/400,775, and 11/400,716 are also incorporated herein by reference.

FIELD OF THE INVENTION

The invention relates to the start up algorithm of a three-phase inverter.

BACKGROUND OF THE INVENTION

The solar energy industry is expanding at a rapid pace. Much of that expansion is due to increases in residential and small commercial photovoltaic (PV) installations. Increasingly these installations are directly connected to the utility grid without the use of batteries. Inverters are the power electronics equipment that converts DC electricity produced by PV panels (collectively a PV array) into AC required by the grid.

For a three-phase inverter to start producing power several variables need to be within programmed tolerances. Some of these tolerances are stipulated by *Standard for Inverters, Converters, Controllers, and Interconnection System Equipment for Use with Distributed Energy Resources*, UL 1741, Edition 1, May 7, 1999, which is incorporated herein by reference. One important start up variable is the input DC voltage. However, this voltage by itself can not tell you when a solar array is experiencing enough solar irradiance to start producing meaningful amounts of power. A PV array in low light conditions can produce a full voltage but still has very little power generating ability. The standard UL 1741 stipulates that an inverter must wait 5 minutes after sufficient DC voltage is detected to begin exporting power to the grid. If after an inverter connects to the grid and it is evident that the power generation level is not significant enough to justify continued operation, the inverter may choose to or be caused to shut down. Another 5 minute waiting period is required before the inverter can re-connect to the grid. This process of start up and shut down can continue for some time in certain situations, such as a cloudy morning. Repeated start up and shut down cycles can cause significant wear and tear on an inverter, especially since often the only moving part in an inverter may be the electrical contacts that connect and disconnect electrically from the grid. It would be advantageous to provide a start up algorithm which limited start up/shut down cycles while still allowing the inverter to connect to the grid in a timely manner when sufficient solar irradiance is present.

SUMMARY OF THE INVENTIONS

The present invention is an algorithm for three-phase inverter start up which meets the standard of UL 1741 while limiting the number of start up and shut down cycles. The algorithm sets up increasingly long waits between attempts to start up.

Additional features and advantages according to the invention in its various embodiments will be apparent from the remainder of this disclosure.

BRIEF DESCRIPTION OF THE DRAWINGS

Features and advantages according to embodiments of the invention will be apparent from the following Detailed Description taken in conjunction with the accompanying drawings, in which:

The FIGURE shows a simplified block diagram of a start up algorithm according to an embodiment of the present invention

DETAILED DESCRIPTION OF THE DRAWINGS

A method of three-phase inverter start up is disclosed herein.

A three-phase inverter, when it detects sufficient DC voltage, starts a mandated five-minute wait period and makes sure there are no utility anomalies such as over or under voltage or over or under frequency conditions on the grid. At the end of the five-minute wait period, the inverter then tries to inject power into a utility grid. If there is insufficient power available from the DC source, most likely a photovoltaic (PV) array, the inverter will shut down. The shut down may be caused by DC voltage falling below a minimum set point as the inverter draws its minimum current from the DC source. In the method of the present invention, the amount of wait time between attempts to start up is increased with each subsequent start up attempt until a set maximum wait time is reached. After a set maximum interval is reached, the cycle of incremental wait times may optionally start over at the minimum five minutes. A specific embodiment of the method of the present invention is given below in conjunction with the logic flow chart of The FIGURE. This specific embodiment is intended to illustrate the method of the present invention and in no way limits other embodiments of the present invention as would be evident to one skilled in the art.

The FIGURE shows a flow chart of an embodiment of the present invention. In The FIGURE, a startup process begins in block 101 with a index variable "i" set to the value zero and the inverter in a state of insufficient voltage at its DC electrical input such as would occur at night or when the PV array is disconnected from the DC electrical input of the inverter during installation or maintenance. Process block 103 shows that the inverter will wait until a set startup DC voltage, for example 170 Volts in one embodiment, is present at its DC electrical input and no error condition exists. An error condition may include, but is not limited to nor necessarily includes but is not limited to the following: grid over voltage, grid under voltage, grid over frequency, grid under frequency, inverter over temperature, DC voltage too low, and DC voltage too high. Sufficient voltage for start up if the DC source is a PV array is defined as an open circuit voltage that indicates the PV array may be experiencing sufficient solar irradiation to produce a significant amount of power. Once sufficient voltage is present, process block 105 shows that the inverter will wait for the five minutes required by UL 1741. Decision Block 107 indicates that the inverter will begin operation converting DC power to AC power unless an error condition exists, including a condition where DC voltage has fallen below the set startup voltage. Process Block 109 shows that the inverter will then operate for a set operating period, (five minutes in this example, although other periods could be determined by one of ordinary skill in the art as a matter of design choice) or until an error such as the DC voltage falling below a minimum set point occurs. Decision Block 111 decides if enough power is being produced over the set period to justify continued operation (100 Watts, in this example, although other power set-points could be chosen by one of ordinary skill in the art as a matter of design choice). If enough power is being produced, Process Block 113 indicates that the index variable "i" is reset to a value of zero and the inverter continues to generate power until output drops below a set point for a set operating period (100 Watts for five minutes in this example). If Decision Block 111 indicates that insufficient power has been produced then the inverter will shut down and wait a programmed amount of time before attempting to start again. Process Blocks 115, 117, 119, and Decision Block 121 show one embodiment of the method of the present invention for increasing the amount of wait time between attempts to start an inverter. Process Block 115 shows that the value of the index variable "i" is used to calculate an increased wait time above the required five minutes. In Process Block 115, the formula multiplies five minutes by two raised to the "i" power and subtracts five minutes. The formula in Process Block 115 uses one formula to produce a geometric increase in wait time. Other formulas may be used such as one producing a linear increase in wait time, or a cubic increase in wait time, and so on, are also conceived as well as a simple lookup table of wait times following no specific mathematical formula. Process Block 117 indicates that the index variable "i" is increased by one. Process Block 119 limits the maximum wait time by resetting the value of "i" to zero once the value of "i" exceeds three. Other techniques may be used to limit maximum wait time such as holding wait time at a set maximum value instead of resetting to the minimum wait time.

Decision Block 121 checks that there is sufficient DC voltage and no error conditions exist. If so the UL 1741 required wait time of five minutes is initiated again as shown in Process Block 105. If not the inverter starts over in Process Block 101, resetting the index variable "i" to zero.

The above disclosed embodiment of the method of the present invention will have the effect of having wait times on successive attempts to start an inverter of: 5, 5, 10, 20, and 40 minutes then starting over at five minutes.

The below examples will illustrate the specific embodiment of the present invention disclosed in the flowchart The FIGURE.

In a morning wake up condition the inverter will begin in Process Block 101 and will wait until there is sufficient light on solar panels at a DC input to the inverter as indicated by Process Block 103. Once sufficient DC voltage is present the inverter will wait five minutes as indicated by Process Block 105 and if no errors are present (Decision Block 107) the inverter will attempt to produce power for five minutes (Process Block 109. Decision Block 111 will check if DC volts dropped below a minimum set point due to the current being drawn from the PV array during the five minutes and if the DC voltage did not fall below the minimum set point did the inverter produce power above the set point level (100 Watts average in this example). In this example the DC voltage falls below the minimum set point the inverter shuts off and the DC voltage will rise again as the load of the inverter is removed. Process Block 115 adds zero wait time and process block 117 increases the value of "i" by one. The value of "i" is one and so process block 119 does nothing. Decision Block 121 senses that the DC voltage has risen above the startup voltage and returns the process to Process Block 105 beginning another five minute wait time. The process repeats twice with five minutes being added to the wait in the next cycle and 15 minutes in the one after. The following cycle sunlight on the PV array is strong enough that inverter begins normal operation and the value of "i" is reset to zero (process blocks 113 and 109.

The example may continue later in the day when an extremely cloudy condition arises. A five minute period will pass where power output is below the set point 100 Watts and the inverter will shut down and begin the cycle of increasing wait times. Once the clouds have passed and the power output rises above 100 watts for five minutes the "i" will be reset to zero and normal operation will continue.

At the end of the day light conditions will fall to a point where the PV array is no longer producing significant power a process similar to that described for the cloudy condition will be initiated. As light continues to fall the DC voltage will fall below the startup value and Decision Block 121 will reset the process to Process Block 101, the value of "i" will be set to zero and the inverter will wait through the night until the DC voltage rises above the startup value (Process Block 103).

It is certainly desirable to have a solar power inverter begin producing power as soon as there is sufficient irradiance on connected solar panels to produce significant power. However, in a prolonged period of dim light conditions, is also desirable to limit the number of startup and shutdown cycles an inverter must endure. A method of systematic increase in wait times between startup attempts is an innovative way to provide quick response time in most situations while limiting the number of startup and shutdown cycles during periods of prolonged dim light.

While an embodiment of the invention has been shown and described, it will be apparent to those skilled in the art that various modifications may be made without departing from the scope of the invention. Therefore, it is intended that the invention not necessarily be limited to the particular embodiments described and illustrated herein.

What is claimed is:

1. A method of operating a three-phase inverter connected to a photovoltaic panel, the method comprising:
   a) monitoring a DC voltage input to the inverter and waiting for a DC voltage to exceed a predetermined value for the DC voltage, keeping the inverter shut down until the DC voltage exceeds the predetermined value for the DC voltage;
   b) operating the inverter for a first predetermined period of time before checking the DC voltage and a DC power level;
   c) interrupting operation of the inverter when the DC voltage is below the predetermined value for the DC voltage or when the DC power level is below a predetermined value for the DC power level;
   d) if operation of the inverter is interrupted then waiting for a second predetermined period of time before resuming operation of the inverter; and
   e) repeating steps (c) and (d) and increasing the second predetermined period of time between successive resumptions of operation.

2. The method of claim 1 wherein the second predetermined period of time decreases to first predetermined period of time after a predetermined number of startup attempts.

3. The method of claim 2 wherein the second predetermined period of time follows a pattern of 5 minutes, 10 minutes, 20 minutes, 40 minutes and then back to 5 minutes to repeat the pattern.

4. The method of claim 1 wherein the second predetermined period of time reaches a maximum value after a predetermined number of startup attempts and is held at the maximum value for successive startup attempts.

* * * * *